US008900008B2

(12) United States Patent
Day, Jr. et al.

(10) Patent No.: US 8,900,008 B2
(45) Date of Patent: Dec. 2, 2014

(54) UNIVERSAL PRESS-FIT CONNECTION FOR PRINTED CIRCUIT BOARDS

(75) Inventors: James A. Day, Jr., Durham, NC (US); Zachary B. Durham, Durham, NC (US); Luke D. Remis, Raleigh, NC (US); Tony C. Sass, Fuquay Varina, NC (US); Gregory D. Sellman, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 13/481,176

(22) Filed: May 25, 2012

(65) Prior Publication Data

US 2013/0316551 A1   Nov. 28, 2013

(51) Int. Cl.
*H01R 13/60* (2006.01)

(52) U.S. Cl.
USPC .......................................................... 439/567

(58) Field of Classification Search
CPC ..................................................... H01R 12/585
USPC .................................................... 439/567, 66
See application file for complete search history.

(56) References Cited

U.S. PATENT DOCUMENTS

| | | | | |
|---|---|---|---|---|
| 4,676,579 A | * | 6/1987 | Ting | 439/825 |
| 5,073,119 A | * | 12/1991 | Soes | 439/82 |
| 5,115,375 A | * | 5/1992 | Garay | 361/760 |
| 5,715,595 A | * | 2/1998 | Kman et al. | 29/845 |
| 6,352,436 B1 | | 3/2002 | Howard | |
| 6,475,042 B1 | * | 11/2002 | Yu | 439/857 |
| 6,593,535 B2 | | 7/2003 | Gailus | |
| 7,628,645 B2 | * | 12/2009 | Baba et al. | 439/567 |
| 7,665,207 B2 | | 2/2010 | Fraley et al. | |
| 7,862,347 B2 | | 1/2011 | Amleshi et al. | |
| 7,927,109 B1 | * | 4/2011 | Gattuso | 439/66 |
| 7,963,776 B1 | | 6/2011 | Morgan | |
| 2004/0108137 A1 | | 6/2004 | Vetter et al. | |
| 2006/0180346 A1 | | 8/2006 | Knight et al. | |
| 2010/0085717 A1 | | 4/2010 | Sweeney et al. | |
| 2011/0104912 A1 | * | 5/2011 | Gattuso | 439/66 |

FOREIGN PATENT DOCUMENTS

| | | |
|---|---|---|
| CN | 201042106 Y | 3/2008 |
| JP | 2005353774 A | 12/2005 |

OTHER PUBLICATIONS

Xie et al., H3C Technologies Co LTD, "CN201042106(Y)—A circuit board penetration hole and its circuit board", Mar. 26, 2008, Abstract of CN201042106(Y), 1 page.
Nagasaka Akira et al., Toyota Motor Corp, "JP2005353774(A)—Substrate Press Fitting and Its Manufacturing Method", Dec. 22, 20065, Abstract of JP2005353774(A), 1 page.

* cited by examiner

*Primary Examiner* — Truc Nguyen
(74) *Attorney, Agent, or Firm* — Katherine S. Brown; Jeffrey L. Streets

(57) ABSTRACT

A universal press-fit connection allows a component having a connector pin to be connected to a compatible plated through hole of a circuit board regardless of circuit board thickness. The connector pin includes a proximate end adjacent the component, a distal end with a fork lock, and a compliant portion between the proximate and distal ends. A multi-width through hole includes a first portion partially extending through the circuit board and a second, wider portion extending beyond the first portion. The fork lock initially moves radially inward upon insertion into the first portion via flexing of the compliant portion, and re-expands when entering the second portion. The compliant portion engages the through hole and the fork lock secures the connector pin in the through hole.

6 Claims, 5 Drawing Sheets

UNIVERSAL PRESS-FIT CONNECTION FOR PRINTED CIRCUIT BOARDS

BACKGROUND

1. Field of the Invention

The present invention relates generally to printed circuit boards, and more particularly to connecting components to printed circuit boards.

2. Background of the Related Art

A printed circuit board (PCB) is a structure used in an electronic device to mechanically support and electrically connect a multitude of electronic components. A printed circuit board includes an electrically insulating substrate on which conductive communication pathways known as signal traces are formed. The signal traces are typically etched from conductive (e.g. copper) sheets laminated onto the substrate. A printed circuit board populated with electronic components may be referred to as a printed circuit assembly (PCA) or a printed circuit board assembly (PCBA). The main PCBA in a computer system is the motherboard or system board. Examples of motherboard components include processors, drive controllers, video controllers, primary memory, interrupt controllers, and BIOS, as well as electronic connectors for interfacing with additional components. Electronic components commonly include an arrangement of thin electrical leads, which are connected to the signal traces at corresponding electrical contacts on the printed circuit board.

Several component connection types are used in the computer industry. Three predominant connection types are conventionally known as surface-mount, pin-through-hole, and compliant pin connections. Surface-mount technology (SMT) is a connection type in which the component is mounted directly onto the surface of the printed circuit board, using short pins, flat contacts, a matrix of solder balls such as a ball grid array (BGA), or terminations on the body of the component. A pin-through-hole connection is an older connection type wherein electrical leads on the component are inserted into holes in the printed circuit board from one side of the printed circuit board and soldered to conductive pads on the opposite side of the printed circuit board. Compliant pin or "press-fit" technology eliminates the need for soldering by force-fitting an oversized contact pin into a plated through hole (PTH). The radial pressure between the pin and the plated through hole produces a high-quality electrical connection between the pin and plated through hole.

Historically, a standard thickness for a circuit board has been 0.062 inches (62 mils). This originated during the evolution of circuit boards, when commonly-available 1/16 inch (62 mil) sheets of Bakelite® were used as an insulating substrate for electronic assemblies. (Bakelite is a registered trademark of Momentive Specialty Chemicals GmbH.) The 62 mil thickness remained a standard as circuit boards evolved to include the use of multiple conductive layers and different, more advanced materials. However, increasingly complex systems with more extensive wiring requirements also led to the development of thicker circuit boards containing a greater number of layers. Printed circuit board thicknesses now vary from 62 mils to sometimes more than 200 mils. The use of different printed circuit board thickness has led to a proliferation of different parts and connectors to accommodate the different PCB thicknesses.

BRIEF SUMMARY

One embodiment is a printed circuit board assembly that includes a circuit board and an electronic component for securing to the circuit board. The electronic component has (at least) one connector pin having a proximate end at a component body, a distal end with a fork lock, and a compliant portion between the proximate and distal ends. The circuit board has a multi-width through-hole for receiving the connector pin of the electronic component. The multi-width through hole includes a first portion that is narrower than the fork lock and partially extends through the circuit board to a depth less than a distance of the fork lock from the connector body. The multi-width through hole also has a second portion that extends to a depth beyond the first portion and is wider than the first portion.

Another embodiment is a method of connecting a component to a circuit board. The method includes forming a connector pin on an electronic component having a proximate end secured to the electronic component, a distal end with a fork lock, and a compliant portion between the proximate and distal ends. The method further includes forming a multi-width through-hole on a circuit board having a circuit board thickness greater than a length of the connector pin, with a first portion that is narrower than each of the compliant portion and the fork lock and extends partially through the circuit board and a second portion that extends beyond the first portion and is wider than the first portion. The connector pin is inserted into the first portion of the through-hole and the fork lock is moved beyond the first portion into the second portion of the through-hole.

DETAILED DESCRIPTION

Figure 1:
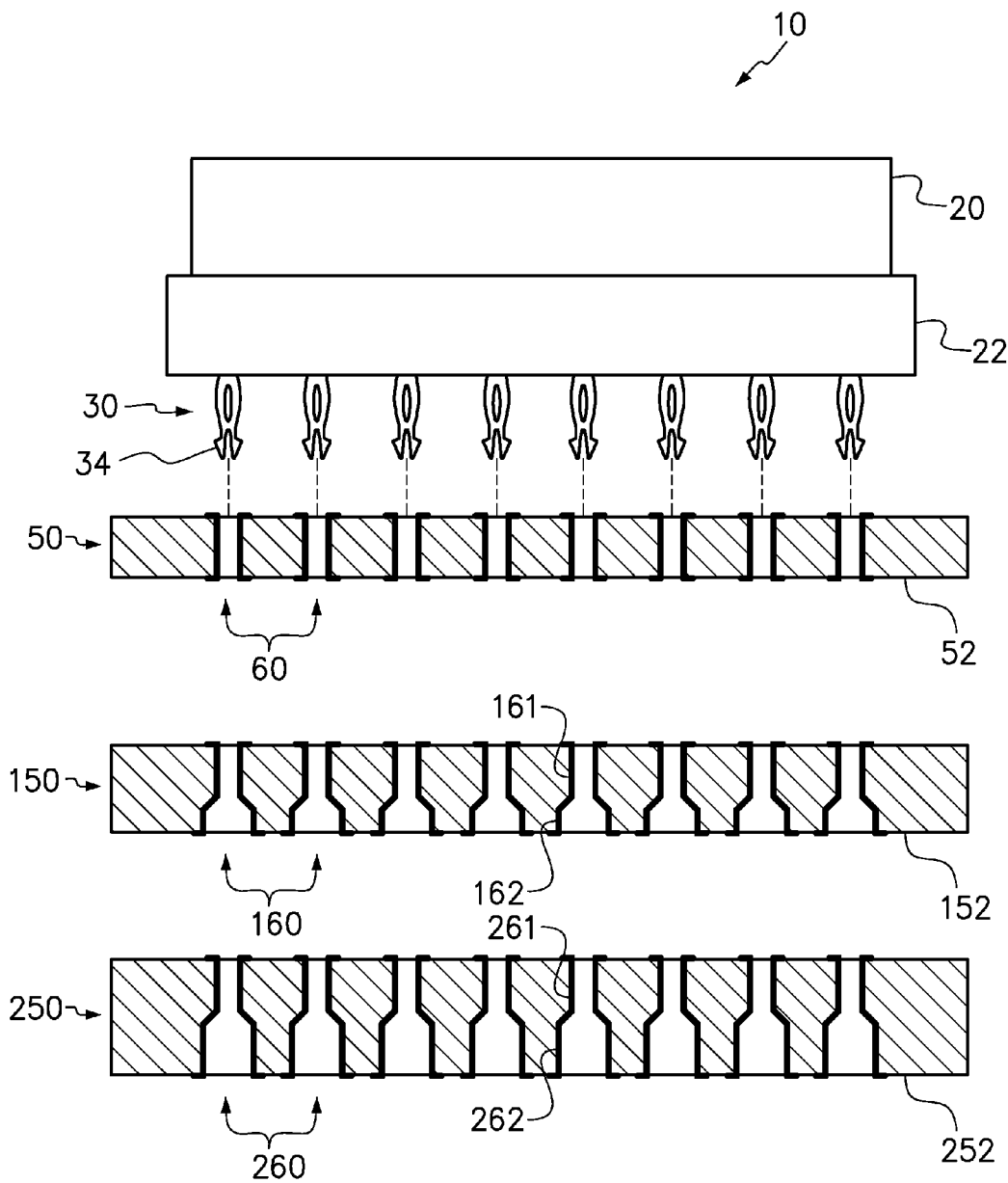
FIG. 1 is a schematic diagram of a universal press-fit connection system for interchangeably securing an electronic component with a predefined size and geometry to circuit boards of different thicknesses.

A printed circuit board assembly and related method are disclosed, providing a universal press-fit connection that enables a single connector pin geometry and size to be interchangeably used with any of a range of different circuit board thicknesses. This universal press-fit connection benefits everyone in the product chain, from parts manufacturers and suppliers to system designers and assemblers to end users. For example, the system may save money in the supply chain by reducing the number of connector types to be designed and stocked. Assembly is also simplified by allowing a component with one particular connector pin geometry and size to be used on a multitude of different circuit board thicknesses.

In one embodiment, a connector pin for a circuit board component combines an intermediately-located compliant portion with a distally-located fork lock. The compliant portion of the connector pin is inwardly flexible in response to insertion of the connector pin into a plated through hole on the circuit board. This compliancy provides a secure electrical connection between the connector pin and the plated through hole for reliable communication of electrical signals across the interface between the connector pin and plated through hole. The compliancy may also help frictionally secure the connector pin within the plated through hole. The fork lock is wider than the compliant portion to lock the connector pin on the printed circuit board. The compliant portion may comprise flexible legs and/or an eyelet, and the fork lock may comprise fork members extending from the compliant portion, such that the fork members move inwardly with the compliant portion by virtue of an inward flexing of the compliant portion. The compliancy thereby allows the fork lock to be moved through a narrower plated through hole or portion thereof.

A scheme is provided for forming the plated through hole according to the thickness of the circuit board, so that the same connector pin geometry and size may be interchangeably used with printed circuit boards of different thicknesses. In one embodiment, the thinnest printed circuit board (e.g. 62 mils) may have a plated through hole of uniform width, such as a circular through hole of uniform diameter. The connector pin length is greater than the printed circuit board thickness. The fork lock and compliant portion can be inserted into the plated through hole from one side of the circuit board and moved through the plated through hole until the fork lock emerges at the other side of the circuit board, thus locking the connector pin to the printed circuit board. According to the scheme, a thicker printed circuit board, whose thickness may be greater than the connector pin length, instead uses a multi-width plated through hole having a width that varies with depth. The multi-width through-hole has a first portion that extends partially through the circuit board and is narrower than the fork lock, and a second portion that extends beyond the first portion. For example, the first portion of the multi-width plated through hole may have substantially the same width as in all other circuit boards, and may have a depth that is substantially the same as the thickness of a thinner (standard) circuit board. The second portion of the plated through hole is wider than the first portion, and is located at a depth reachable by the fork lock when the connector pin is inserted beyond the first portion. As the connector pin is inserted into the first portion of the plated through hole, the compliant portion flexes inwardly, allowing the fork lock and compliant portion to be moved through the plated through hole. The fork lock at least partially re-expands when the fork lock emerges in the second, wider portion of the plated through hole, thus locking the connector pin to the printed circuit board. By maintaining the same width and depth of a first portion of each multi-width plated through hole, the same connector pin geometry can be used with various circuit boards having different thicknesses.

One embodiment is a printed circuit board assembly that includes a circuit board and an electronic component for securing to the circuit board. The electronic component has (at least) one connector pin having a proximate end at a component body, a distal end with a fork lock, and a compliant portion between the proximate and distal ends. The circuit board has a multi-width through-hole for receiving the connector pin of the electronic component. The multi-width through hole includes a first portion that is narrower than the fork lock and partially extends through the circuit board to a depth less than a distance of the fork lock from the connector body. The multi-width through hole also has a second portion that extends to a depth beyond the first portion and is wider than the first portion.

Another embodiment is a method of connecting a component to a circuit board. The method includes forming a connector pin on an electronic component having a proximate end secured to the electronic component, a distal end with a fork lock, and a compliant portion between the proximate and distal ends. The method further includes forming a multi-width through-hole on a circuit board having a circuit board thickness greater than a length of the connector pin, with a first portion that is narrower than each of the compliant portion and the fork lock and extends partially through the circuit board and a second portion that extends beyond the first portion and is wider than the first portion. The connector pin is inserted into the first portion of the through-hole and the fork lock is moved beyond the first portion into the second portion of the through-hole.

FIG. 1 is a schematic diagram of a universal press-fit connection system 10 for interchangeably securing an electronic component 20, having a predefined connector pin size and geometry, to circuit boards 50, 150, 250 of different thicknesses. The component 20 includes a connector 22 having a plurality of connector pins 30. In this example, the connector 22 includes a connector body that is visually distinct from the rest of the component 20, although one of ordinary skill in the art understands that on some components the portion referred to as the connector, and which includes the connector pins, may be at a location on a body of the component where the pins emerge from the component without a connector body that is visually distinct from the rest of the component body. Although not required, all of the connector pins 30 on the connector 22 are assumed to be identical to each other in this embodiment. The system 10 may include any number of circuit boards, three examples of which are individually referenced, in order of increasing thickness, at 50, 150, and 250. For example, the first circuit board 50 may be 62 mils thick, the second circuit board 150 may be 117 mils thick, and the third circuit board 250 may be 200 mils thick. According to the disclosed plated through hole scheme, the connector 22 with a single connector pin geometry and size may be used with any of these circuit boards 50.

The first and thinnest circuit board 50 in the system 10 has a plurality of uniform-width plated through holes 60 in the same relative positions as the connector pins 30 on the electronic component 20. The connector pins 30 and plated through holes 60 may have any of a variety of different cross-sectional shapes, such as circular, polygonal, or even asymmetric cross-sections. To simplify discussion, however, the plated through holes 60 are assumed to have a circular cross-section (the connector pins 30 may or may not also be circular). Thus, the first, thinnest circuit board 50 in the system 10 has circular plated through holes 60 of uniform diameter along its axial length (depth). The connector 22 may be pressed onto the first circuit board 50 with the connector pins 30 aligned with the uniform-diameter plated through holes 60, to move the connector pins 30 into the plated through holes 60. Each connector pin 30 has a connector pin length that is greater than a thickness of the first circuit board 50, and the fork locks 34 on distal ends of the connector pins 30 will emerge from the plated through holes 50 beyond a lower surface 52 of the printed circuit board 50. The uniform-diameter plated through holes 60 and their functional relationships with the connector pins 30 are further discussed below in association with FIGS. 2 and 3.

The second and third circuit boards 150, 250 are each thicker than the first circuit board 50. The second circuit board 150 has multi-width plated through holes 160 in the same relative positions as the connector pins 30 on the electronic component 20. Each multi-width plated through hole 160 includes a first portion 161 having a first diameter and a second portion 162 having a second diameter that is larger than the diameter of the first portion 161. The connector 22 may be pressed onto the second circuit board 150 with the connector pins 30 aligned, as shown, with the multi-width plated through holes 160. The thickness of the second circuit board 150 is greater than the length of the connector pins 30, and the fork locks 34 on distal ends of the connector pins 30 will not emerge from the plated through holes 160 beyond a lower surface 152 of the printed circuit board 150. The depth of the first portion 161 is selected so that when the connector 22 is press fit onto the second printed circuit board 150, the fork locks 34 will emerge beyond the first portion 161 and into the second portion 162 of the plated through holes 160, where the fork locks 34 at least partially re-expand to lock the connector 22 onto the second printed circuit board 150.

The third circuit board 250 in the system 10 is even thicker than the second circuit board 150. The third circuit board 250 also has multi-width plated through holes 260 in the same relative positions as the connector pins 30 on the electronic component. Each multi-width plated through hole 260 also includes a first portion 261 having a first diameter and a second portion 262 having a second diameter that is larger than the diameter of the first portion 261. The first portion 261 of the multi-width plated through hole 260 on the third circuit board 250 may be identical to the first portion 161 of the multi-width plated through hole 160 on the second circuit board 150. However, the second portion 262 of the plated through hole 260 on the third circuit board 250 is longer than the second portion 162 of the plated through hole 160 on the second circuit board 150, due to the third circuit board 250 being thicker than the second. The connector 22 may be pressed onto the third circuit board 150 with the connector pins 30 aligned with the plated through holes 260. The thickness of the third circuit board 250 is greater than the length of the connector pins 30, and the fork locks 34 on distal ends of the connector pins 30 will not emerge from the plated through holes 260 beyond a lower surface 252 of the printed circuit board 250. However, again, the depth of the first portion 261 is selected so that when the connector 22 is press fit onto the second printed circuit board 150, the fork locks 34 will emerge beyond the first portion 261 and into the second portion 262 of the plated through holes 260 to lock the connector pins 30 onto the third printed circuit board 250. The multi-diameter plated through holes 260 and their functional relationships with the connector pins 30 are further discussed below in association with FIGS. 4 and 5.

Figure 2:
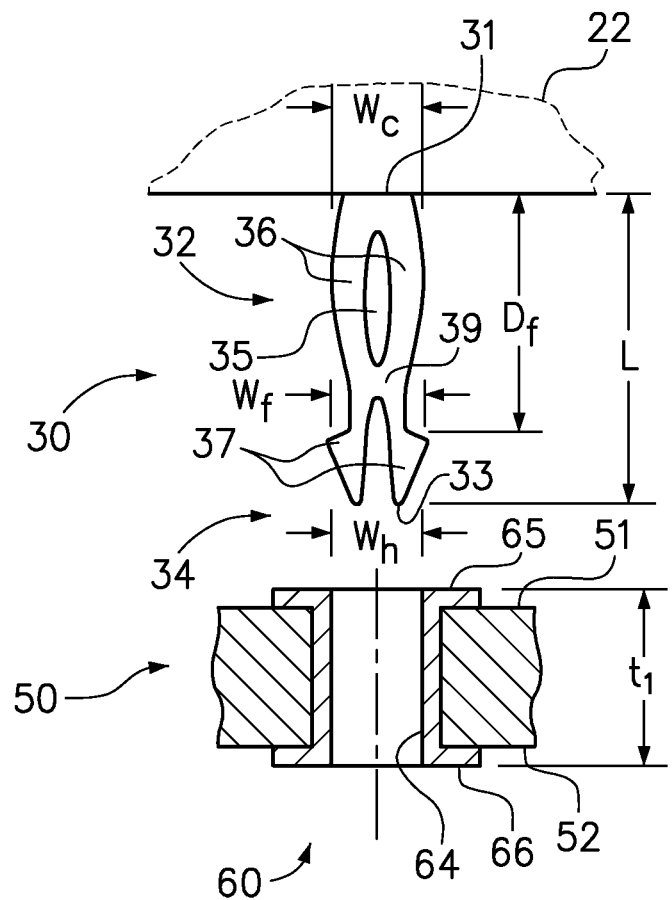
FIG. 2 is a schematic diagram of the thinnest circuit board of FIG. 1, further detailing one of the connector pins aligned for insertion into a uniform-diameter plated through hole.

FIG. 2 is a schematic diagram of the first and thinnest circuit board 50 of FIG. 1, further detailing one of the connector pins 30 aligned for insertion into one of the uniform-diameter plated through holes 60. The plated through hole 60 includes a layer of electrically conductive material (i.e. plating) 64. The plating 64 substantially covers the entire surface along the uniform internal diameter ("ID") of the plated through hole, and extends to or includes opposing first and second ("upper" and "lower") conductive pads 65, 66 on the respective upper and lower surfaces 51, 52 of the circuit board 50. One or more conventional conductive paths (i.e. circuit traces, not shown) may be formed on the circuit board 50, also by electroplating, and may extend to either conductive pad 65, 66. When the connector pin 30 is inserted into the plated through hole 60, the connector pin 30 electrically contacts the plated through hole 60 so that signals can be communicated to and from the component connector 22 along the signal trace (s).

The connector pin 30 includes a proximate end 31 where the connector pin 30 is attached to the connector 22 and a distal end 33 opposite the proximate end 31. The physical structure of the connector pin 30 leading to an internal wiring may actually protrude a small distance into the connector 22, such as if the connector pin 30 is embedded in a molded plastic body of the component or connector 22, so the proximate end 31 in this embodiment refers to the location where the connector pin 30 intersects with the connector 22 and not the physical point where the structure of the connector pin may terminate inside the connector 22. A fork lock 34 is provided at the distal end 33 for retaining the connector pin 30 in the plated through hole 60 once inserted into the plated through hole 60. The connector pin 30 also includes a compliant portion 32 intermediately-located between the proximate end 31 and distal end 33. The compliant portion 32 is inwardly flexible. The compliant portion 32 defines an eyelet 35 that allows connector pin material adjacent to the eyelet 35 to be flexed inwardly. The connector pin material adjacent to the eyelet 35 optionally comprises opposing legs 36 that can be independently flexed. As shown, the legs 36 may be bridged by a connecting portion 39, though such a connecting portion is not required. Bridged legs or fork members will tend to take a greater insertion force and provide a greater resistance to pulling out. If the connectors are not capable of withstanding the higher insertion force, then an independently flexible design without a connecting portion may be preferred. The fork lock 34 optionally comprises a plurality of fork members 37 coupled to the respective legs 36, which extend outwardly from a connector pin centerline. Thus, the fork members 37 may move with the flexing of the legs 36, and vice-versa.

The geometry and dimensions of the connector pin are selected so that the connector pin 30 will work interchangeably with the uniform-diameter plated through hole of the thinnest, first circuit board 50 and the multi-width plated through hole of any of the thicker circuit boards 150, 250 (see FIG. 1). Though the physical structure of the connector pin 30 may actually protrude slightly into the connector 22, the connector pin length "L" refers to the portion of the connector pin that extends from the connector 22. The distance from the connector 22 to the fork lock 34 is labeled "Df" and is equal to or greater than the thickness t1 of the first circuit board 50 plus any pad or plating that makes the hole longer. That way, the connector pin 30 may be inserted far enough into the plated through hole 60 that the fork lock 34 will emerge from the plated through hole 60 beyond the lower surface 52. In a relaxed state of the connector pin 30 when not inserted, a width "Wf" of the fork lock 34 is greater than a width Wh of the plated through hole 60, so that the fork lock 34 is moved radially inwardly when the connector pin 30 is axially inserted into the plated through hole 60. The compliant portion 32 flexes (i.e. elastically deforms) to allow the radial movement of the fork lock 34. The width Wf of the fork lock 34 is also greater than a width "Wc" of the compliant portion 32 so that the fork lock 34 will lock the connector pin 30 in the plated through hole 60 when the fork lock 34 at least partially re-expands once it has emerged from the plated through hole 60. The width Wc of the compliant portion 32 is at least slightly greater than the width/diameter Wh of the plated through hole 60, so that once the fork lock 34 has emerged beyond the plated through hole 60, the compliant portion 32 re-expands to outwardly contact the plated through hole 60.

Figure 3:
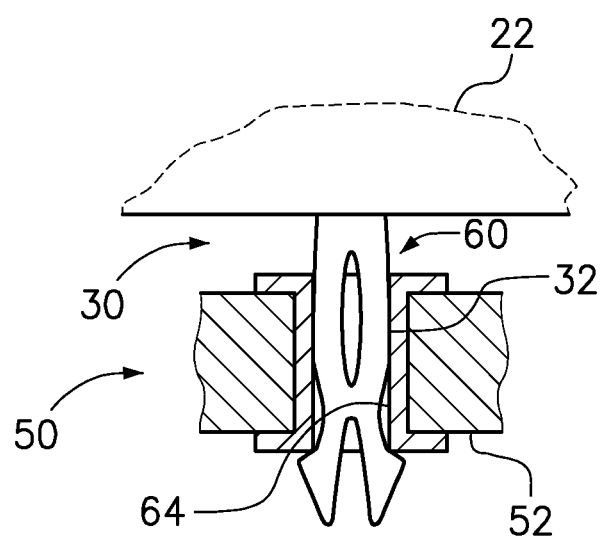
FIG. 3 is a schematic diagram of the thinnest circuit board with the connector pin inserted to a locked position into the uniform-diameter plated through hole.

FIG. 3 is a schematic diagram of the first/thinnest circuit board 50 with the connector pin 30 inserted to a locked position into the uniform-diameter plated through hole 60. In the locked position, the fork lock 34 has been moved beyond the plated through hole 60, past the lower surface 52 of the printed circuit board 50, to lock the connector pin 30 on the printed circuit board 50. The compliant portion 32 of the connector pin 30 is expanded into contact with the plated inner diameter (ID) surface 64 of the plated through hole 60. A slight gap is permitted between the connector 22 and the printed circuit board 50, as shown in this highly-enlarged view of the connector pin 30 and printed circuit board. The slight gap may help ensure that all of the connector pins 30 (see FIG. 1) can be moved to the locked position when the connector 22 is pressed into connection with the printed circuit board 50. However, dimensional tolerances can be controlled to minimize this gap and produce a very "tight" connection if desired.

Figure 4:
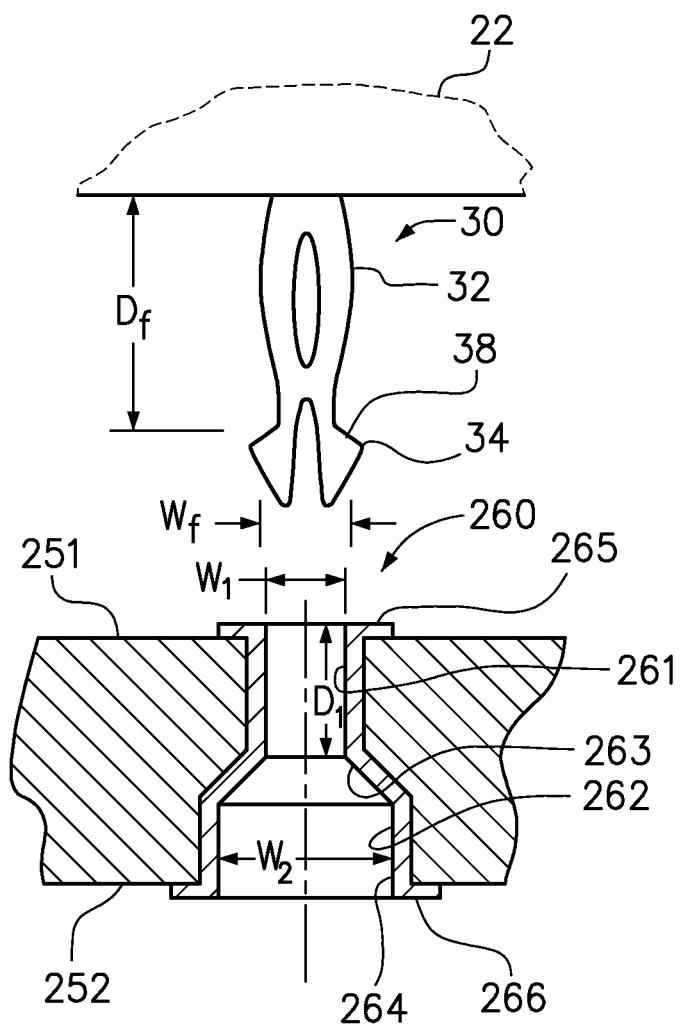
FIG. 4 is a schematic diagram of the thickest circuit board of FIG. 1, further detailing one of the connector pins aligned for insertion into a multi-width plated through hole.

FIG. 4 is a schematic diagram of the third and thickest circuit board 250 of FIG. 1, further detailing one of the connector pins 30 aligned for insertion into one of the multi-diameter plated through holes 260. The multi-width plated through hole 260 includes the narrower first portion 261, the wider second portion 262, and an internal shoulder 263 that tapers outwardly from the first portion 261 to the second portion 262. The first portion 261 has a depth D1 and a width/diameter W1. The second portion 262 extends beyond the first portion 261 through the lower surface 252 of the printed circuit board 250. The second portion 262 includes the shoulder 263, and has a width/diameter W2 (below the shoulder) 263 that is greater than the width/diameter W1 of the first portion 261. The plated through hole 260 includes a layer of electrically conductive material (i.e. plating) 264 that covers the entire plated through hole 260, including the first and second portions 261, 262 and the internal shoulder 263. The plating 264 extends to or includes opposing first and second ("upper" and "lower") conductive pads 265, 266 on the respective upper and lower surfaces 251, 252 of the circuit board 250. As with any of the circuit boards in the system of FIG. 1, one or more electroplated circuit traces formed on the circuit board 250 may extend to either conductive pad 265, 266. When the connector pin 30 is inserted into the plated through hole 60, the connector pin 30 will electrically contact the plated through hole 60 so that signals can be communicated to and from the component connector 22 along the signal trace(s).

The connector pin geometry is compatible with the plated through holes on any of the circuit boards of FIG. 1. Thus, the same connector pin 30 used to make a connection with a uniform-diameter plated through hole on the thinnest circuit board 50 (FIGS. 2 and 3) can also be used to make a connection with the multi-width plated through hole 260 of FIG. 4. The distance Df from the connector 22 to the fork lock 34 is at least slightly greater than the depth D1 of the first portion 261 of plated through hole 260. That way, the connector pin 30 may be inserted into the plated through hole 260 until the fork lock 34 has moved beyond the first portion 261 and into the second portion 262 of the plated through hole 260. In the relaxed state of the connector pin 30, the width Wf of the fork lock 34 is greater than the width W1 of the first portion 261 of the plated through hole 260, so that the fork lock 34 is moved radially inwardly in response to an axial insertion of the connector pin 30 into the plated through hole 260. In the relaxed state of the connector pin 30, the width Wc of the compliant portion 32 is at least slightly greater than the width/diameter W1 of the first portion 261 of the plated through hole 260, so that once the fork lock 34 has moved into the second portion 262 and radially re-expanded, the compliant portion 32 will outwardly contact the first portion 261 of the plated through hole 260. Note that the second portion 262 of the plated through hole 260 is not required to be wider than the fork lock 34; so long as the second portion 262 is wider than the first portion 261, the fork lock 34 should at least partially re-expand when moved beyond the first portion 261. A tapered portion 38 on the fork lock 34 has a profile that matches the tapered internal shoulder 263 of the plated through hole 250, so that the tapered portion 38 of the fork lock 34 will seat against the tapered shoulder 263 of the plated through hole 260 when the fork lock 34 is moved beyond the narrower first portion 261 and into the wider second portion 262 of the plated through hole 260.

Figure 5:
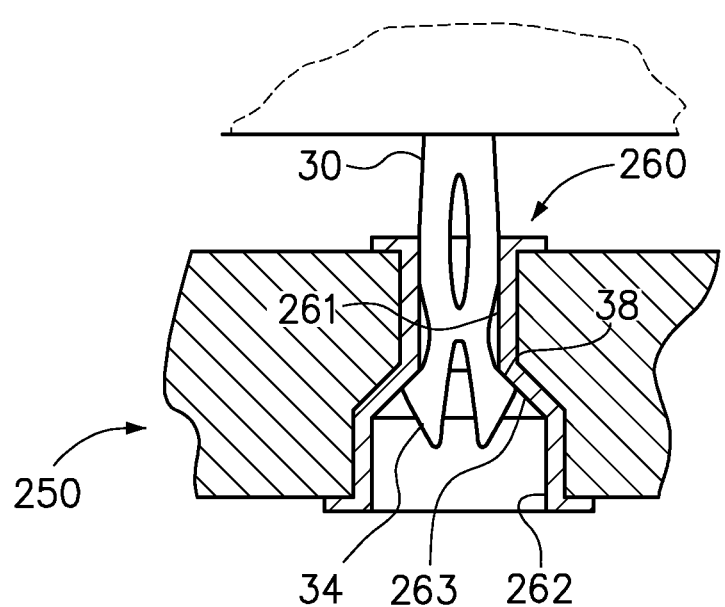
FIG. 5 is a schematic diagram of the thickest circuit board with the connector inserted to a locked position in the multi-width plated through hole.

FIG. 5 is a schematic diagram of the third/thickest circuit board 250 with the connector pin 30 inserted to a locked position into the multi-width plated through hole 260. In the locked position, the fork lock 34 has been moved beyond the first portion 261 and into the second portion 262 of the plated through hole 260, to lock the connector pin 30 on the printed circuit board 250. The compliant portion 32 of the connector pin 30 is expanded into contact with the plated first portion 261 of the plated through hole 260. The tapered portion 38 on the fork lock 34 is seated against the matching tapered internal shoulder 263 of the plated through hole 260. The connector pin 30 is thereby locked onto the printed circuit board 250 without protruding all the way through the printed circuit board 250.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A printed circuit board assembly, comprising:
an electronic component with a connector pin having a proximate end at a component body, a distal end with a fork lock, and a compliant portion between the proximate and distal ends;
a circuit board having a multi-width through-hole for receiving the connector pin of the electronic component, the multi-width through hole including a first portion that is narrower than the fork lock and partially extends from a first surface of the circuit board to a depth less than a distance of the fork lock from the connector body and a second portion that extends to a depth beyond the first portion and is wider than the first portion; and an internal shoulder in the circuit board that tapers outwardly from the first portion to the second portion of the through hole; and a tapered portion on the fork lock having a profile matching the tapered internal shoulder of the through hole, such that the tapered portion of the fork lock seats against the tapered shoulder of the through hole when the fork lock is moved beyond the narrower first portion and into the wider second portion of the through-hole.

2. The printed circuit board assembly of claim 1, further comprising:

an electrically conductive plating covering the first and second portions of the through hole.

3. The printed circuit board assembly of claim 1, wherein the compliant portion of the connector pin comprises opposing legs that are inwardly flexible.

4. The printed circuit board assembly of claim 3, wherein the fork lock comprises outwardly-extending fork members coupled to the legs, such that the fork members move with the flexing of the legs.

5. The printed circuit board assembly of claim 1, wherein the compliant portion of the connector pin comprises an eyelet defined by surrounding connector pin material that flexes inwardly.

6. The printed circuit board assembly of claim 1, further comprising:

another circuit board having a thickness of less than a distance of the fork lock from the connector body, and having a uniform-width through hole wherein a width of the compliant portion of the connector pin is wider than the uniform-width through hole.

* * * * *